US006687973B2

(12) United States Patent
Hewson et al.

(10) Patent No.: US 6,687,973 B2
(45) Date of Patent: Feb. 10, 2004

(54) OPTIMIZED METAL FUSE PROCESS

(75) Inventors: Melissa M. Hewson, Plano, TX (US); Ricky A. Jackson, Richardson, TX (US); Abha Singh, Fairview, TX (US); Toan Tran, Rowlett, TX (US); Howard L. Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 236 days.

(21) Appl. No.: 09/997,980

(22) Filed: Nov. 30, 2001

(65) Prior Publication Data

US 2002/0062549 A1 May 30, 2002

Related U.S. Application Data

(60) Provisional application No. 60/250,324, filed on Nov. 30, 2000.

(51) Int. Cl.[7] .................................................. H01S 4/00
(52) U.S. Cl. ........................ 29/592.1; 29/29.41; 29/846
(58) Field of Search ................................. 29/846, 29.41, 29/29.42, 593, 592.1

(56) References Cited

U.S. PATENT DOCUMENTS

| 6,214,681 | B1 | * | 4/2001 | Yu |
| 6,261,873 | B1 | * | 7/2001 | Bouldin et al. |
| 6,476,454 | B2 | * | 11/2002 | Suguro |
| 6,617,612 | B2 | * | 9/2003 | Zhang et al. |

FOREIGN PATENT DOCUMENTS

JP    57-202778    * 12/1982

* cited by examiner

Primary Examiner—Carl J. Arbes
(74) Attorney, Agent, or Firm—Jacqueline J. Garner; W. James Brady, III; Frederick J. Telecky, Jr.

(57) ABSTRACT

A metal fuse process that uses a thinner (e.g., 6000 Å) oxide (108) over the top interconnect (102). The oxide (108) is removed over the probe pads (106) for testing but is not removed over the fuses (104). Because the oxide (108) is thin at the upper corners of the fuse (104), the oxide (108) cracks over the fuse (104) during a laser pulse (114). A wet etch is then used to dissolve the exposed fuses (104).

13 Claims, 2 Drawing Sheets

OPTIMIZED METAL FUSE PROCESS

This application claims priority under 35 USC §119(e)(1) of provisional application No. 60/250,324 filed Nov. 30, 2000.

FIELD OF THE INVENTION

The invention is generally related to the field of semiconductor processing and more specifically to a metal fuse process.

BACKGROUND OF THE INVENTION

In some integrated circuits, alternate interconnect paths are created to increase yield. For example, in SRAM circuits, after the last interconnect level is formed, the functionality of the device is measured. Defective interconnect paths are severed and replaced, with alternative interconnect paths. The defective interconnect paths are severed by "blowing" a fuse. During this process, a high power laser is directed at fuses that need to be removed. As a result, the fuse is for the most part, vaporized by the high power laser pulse. A wet etch is then used to remove any remaining fuse material from the blown fuse link as well as material from the fuse that may have been redeposited on the surface during the blowing process.

One prior art fuse process is shown in FIGS. 1A–1D. The top metal interconnect layer is used to form both fuses, like fuse 30 and probe pads, like probe pad 40. The top metal interconnect comprises aluminum 42 with an overlying TiN barrier layer 44. 8000 Å of oxide 52 are deposited using a high-density plasma (HDP) process. A resist pattern 54 is formed exposing the areas of oxide 52 over both the fuses and the probe pads, as shown in FIG. 1A. A single etch is then used to expose the fuses 30 and probe pads 40, as shown in FIG. 1B. An etch chemistry is used that etches both oxide and TiN. As a result of the etch and overetch required to ensure that all desired areas across the wafer are cleared, the fuse links 30 are degraded.

The circuits are then probed to determine which fuse links should be blown to fix defective circuits.

Next, a 3000 Å conformal oxide layer 56 is deposited over the structure, as shown in FIG. 1C. Layer 56 completely covers the exposed fuses 30 and provides protection for the exposed aluminum of the probe pads 40. A laser pulse is then directed towards the fuses that need to be removed. The fuse 30 cracks or breaks off at the weakest point, as shown in FIG. 1D. A wet etch is then used to wash away any remaining broken fuses and debris and dissolve fuse links that may be still attached through cracks in the conformal oxide.

Unfortunately, a blown fuse that does not crack correctly can jeopardize adjacent fuses that may still be desired. As a result, this process may result in degraded or even missing fuses.

SUMMARY OF THE INVENTION

The invention is a metal fuse process that uses a thinner (e.g., 6000 Å) oxide over the top interconnect. Because the oxide is thin at the upper corners of the fuse, the oxide cracks over the fuse during a laser pulse. A wet etch is then used to dissolve the exposed fuses.

An advantage of the invention is providing a metal fuse process the offers improved yield by avoiding over etching of fuses.

This and other advantages will be apparent to those of ordinary skill in the art having reference to the specification in conjunction with the drawings.

DETAILED DESCRIPTION OF THE EMBODIMENTS

Figure 1A:
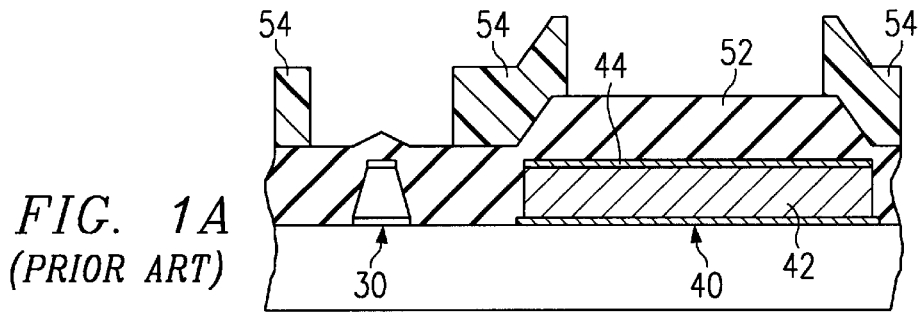
FIGS. 1A–1D are a cross-sectional diagrams of a prior art fuse process at various stages of fabrication.
Figure 1B:
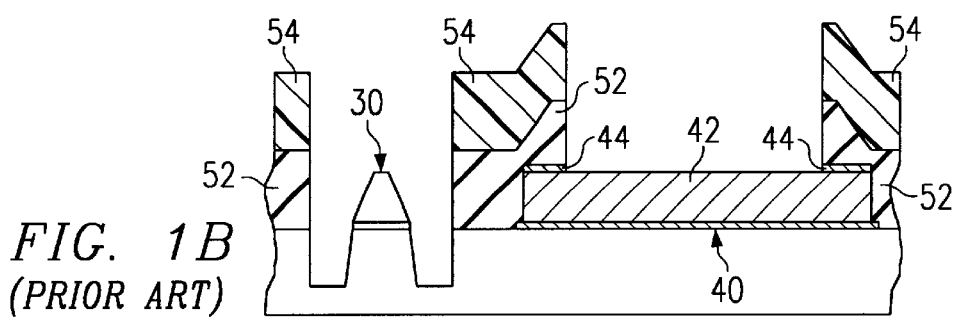
Figure 1C:
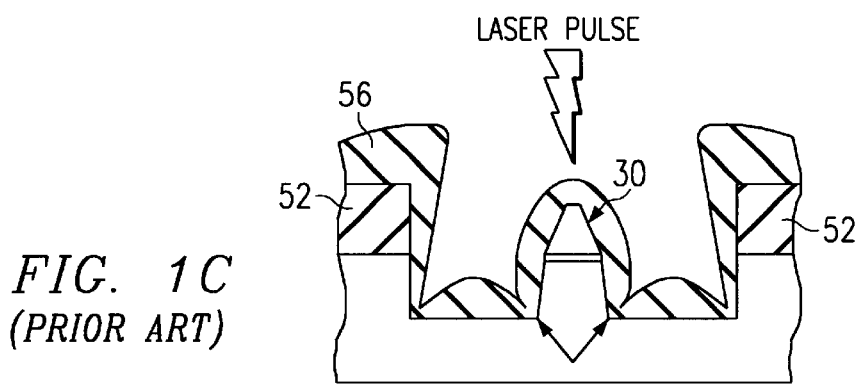
Figure 1D:
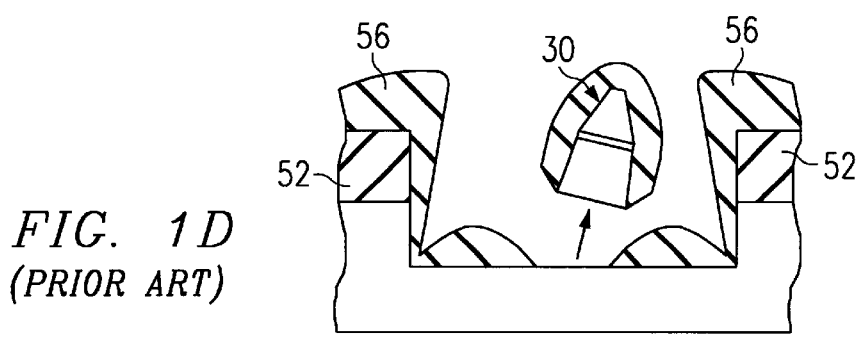

The invention will now be described in conjunction with a combined fuse etch and probe pad open process for aluminum top metal interconnect. It will be apparent to those of ordinary skill in the art that the invention may be applied to other fuse processes.

The invention uses a thinner oxide over the top interconnect. A thinner oxide causes weak points to be formed at the upper corners of the fuse. These weak point crack and may break off when a laser pulse is applied. The fuse is then exposed, either entirely or through the cracks, to a wet etch that removes the fuse. Using this process, fuses may be removed without jeopardizing adjacent fuses even when minimum design rule spacings are used.

FIGS. 2A–2D show a fuse etch and probe pad open process according to an embodiment of the invention. A semiconductor body 100 is processed though the top metal interconnect 102. Semiconductor body 100 is typically a silicon substrate having transistors, isolation structures, and other elements such as capacitors formed therein and/or thereon. Multiple metal interconnect layers are typically formed over the substrate. Metal interconnect 102 is the uppermost interconnect layer. Metal interconnect 102 comprises a metal, such as aluminum, with appropriate upper and lower barrier layers. Some appropriate barriers include, Ti, TiN, combinations of Ti and TiN, and TaN. In the preferred embodiment, metal interconnect 102 comprises aluminum with an upper barrier layer of TiN.

Metal interconnect 102 may be used to form a variety of fuses 104 and probe pads 106. Fuses are used to increase yield. For example, in SRAM circuits, after the last interconnect level is formed, the functionality of the device is measured. Probe pads 106 are used to communicate with the device to determine the functionality. Defective interconnect paths are severed by blowing (removing) a fuse. The defective paths are later replaced with alternative interconnect paths.

An alternative use for fuses is for identifying individual die. Selected fuses are blown, not to eliminate defective paths, but for forming a Die ID. Die Ids are used for tracking and later identifying individual die. These blown fuses are not later replaced with alternative interconnect paths.

An oxide layer 108 is formed over the top interconnect 102. Oxide layer 108 is deposited to a thickness such that the corners of the fuse 104 are just barely covered or just barely exposed. The thickness of the oxide 108 above the corners of the fuse is in the range of 0 Å to 1500 Å. As an example, for the top interconnect thickness of 5400 Å (125 Å Ti+5000 Å AlCu+275 Å TiN), a thickness of 6000 Å may be used for the oxide layer 108. A thicker oxide of approximately 8000 Å was used in the prior art for the same top interconnect height.

In the preferred embodiment, an HDP process is used to form oxide layer 108. An HDP process has the effect of forming a "top hat" portion over the fuse 106. The "top hat" forms as a result of the simultaneous deposition and etch components of an HDP process. Using an HDP process has the added advantage of forming material thinner at the corners than over the center of the fuse. The thinner material at the corners provides a known weak point, so the break points during a laser pulse are more predicable.

Figure 2A:
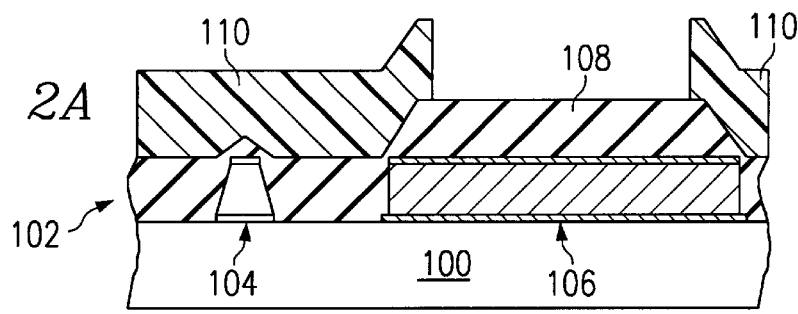
FIGS. 2A–2E are cross-sectional diagrams of a fuse process at various stages of fabrication according to the invention.

Still referring to FIG. 2A, a pattern 110 is formed over the oxide layer 108. Pattern 110 is typically a photoresist pattern. Pattern 110 covers oxide layer 108 except where probe pads 104 are located. Fuses 106 are covered by pattern 110. This is different from the prior art in which both the probe pads and fuses were exposed.

Figure 2B:
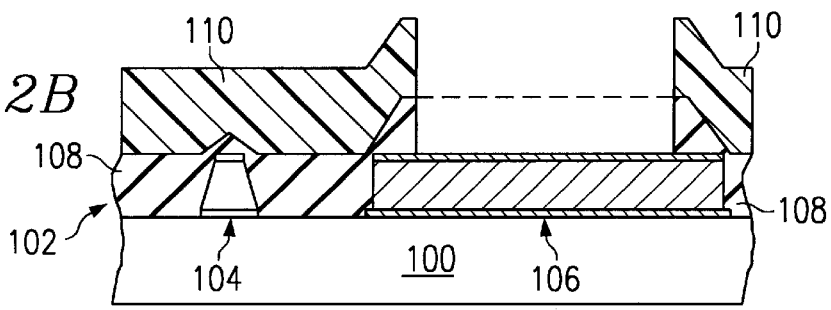
Figure 2C:
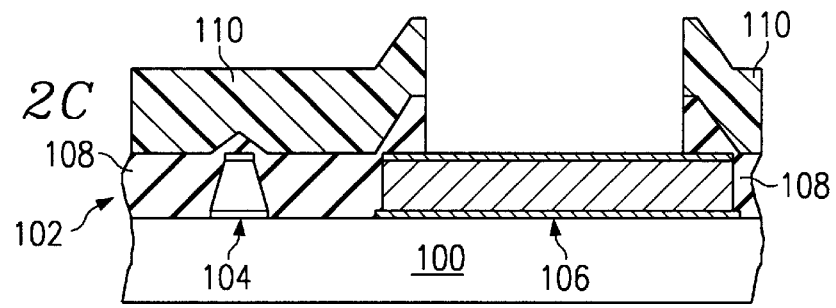

Using pattern 110, the exposed portion of oxide layer 108 over the probe pads 104 is removed, as shown in FIG. 2B. In the preferred embodiment, an etch chemistry is used that allows for etching of both oxide and TiN. The etch clears the oxide 108 and is continued to also remove the upper barrier of top interconnect 102, as shown in FIG. 2C. Suitable etches or combinations of etches are known in the art for etching the oxide and upper barrier layer material. Pattern 110 is then removed.

At this point, the device may be probed to determine functionality using probe pads 106. Defective paths are located and the associated fuses 104 are identified. These associated fuses 104 are the fuses that will be "blown" or removed.

In an alternative embodiment of the invention, it is possible to eliminate this patterning and etching step by probing the wafers to determine which fuses should be blown prior to the HDP oxide deposition step. A cost saving results from eliminating one masking step. This is not a preferred embodiment because probing with the metal exposed has been shown to decrease yield due to particles generated by the probing process.

Figure 2D:
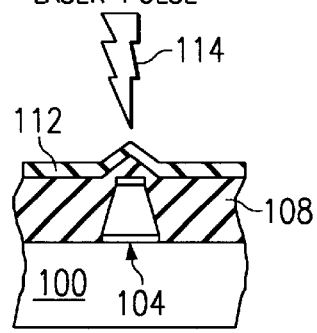

Referring to FIG. 2D, a conformal oxide layer 112 is deposited over the structure. Conformal oxide layer 112 is used to protect the probe pads from the fuse etch process. The fuses that are not going to be removed are also protected by conformal oxide 112. This is important when fuse corners are exposed by oxide 108. A thickness of approximately 800 Å to 1200 Å may be used for conformal oxide layer 112. A plasma enhanced tetraethyoxysilane (PETEOS) process may be used to deposed the conformal oxide layer 112.

Figure 2E:
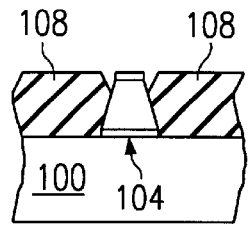

After depositing conformal oxide layer 112, a laser pulse 114 is directed at the fuses 104 to be removed. The laser pulse 114 causes cracking at the weakest point. The weakest point is typically the upper corners when a HDP process is used to form oxide layer 108. Cracking at the upper corners typically causes the portion of oxide layers 108 and 112 over the fuse 104 to break off as shown in FIG. 2E.

In contrast, the prior art processing causes cracking to occur at the lower corners of the fuse through a thicker oxide. Using the prior art process, large cracks could occur that extended to adjacent fuses resulting a loss of the adjacent fuses. Only small cracks around the blown fuse sites were found to occur using the process of the invention. Accordingly, the present process may be used with minimum design rule spacings for the fuses without jeopardizing adjacent fuses.

A wet etch is then used to dissolve the exposed fuses and wash away all debris. Even if the portions of oxide layer 108 and 112 do not break off, sufficient cracks are formed above the fuse to enable the wet etch to dissolve the fuses. Suitable wet etch chemistries are known in the art. For example, an etch chemistry of 90 sec Surf+660 sec SC1+15 sec HF may be used.

Processing then continues to form the alternate interconnect paths, protective overcoat, and packaging.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:
    forming a metal interconnect layer over a semiconductor body, said metal interconnect layer comprising a plurality of fuses and a plurality of probe pads;
    depositing a first oxide layer over the metal interconnect layer, said first oxide layer having a thickness above corners of said plurality of fuses in the range of 0 Å to 1500 Å;
    conformally depositing a second oxide layer over said first oxide layer and said plurality of probe pads;
    directing a laser pulse toward a selected subset of said plurality of fuses to form cracks in at least said second oxide layer;
    wet etching to remove said selected subset of fuses.

2. The method of claim 1, wherein said step of depositing said first oxide layer comprises a high density plasma (HDP) oxide deposition such that said first oxide layer is thinner at said corners of each of said fuses than at a center of each of said fuses.

3. The method of claim 1, further comprising the steps of:
    forming a pattern over said first oxide layer, said pattern covering said plurality of fuses and exposing a portion of said first oxide layer over said plurality of probe pads; and
    removing said exposed portion of said first oxide layer prior to said step of conformally depositing the second oxide.

4. The method of claim 3 wherein said step of removing said exposed portion of said first oxide layer also removes an upper barrier layer of said top interconnect over said probe pads.

5. The method of claim 1, wherein a portion of said first and second oxide layers over said selected subset of fuses breaks off during said step of directing a laser pulse.

6. The method of claim 1, wherein said first oxide layer has a thickness of approximately the metal layer thickness plus 500 Å.

7. The method of claim 1, wherein said second conformal oxide layer has a thickness of approximately 800 Å to 1200 Å.

8. The method of claim 1, wherein said cracks are also formed in said first oxide layer.

9. A method for fabricating an integrated circuit, comprising the steps of:
    forming a metal interconnect layer on a surface of a semiconductor body, said metal interconnect layer comprising a plurality of fuses and a plurality of probe pads;
    depositing a first oxide layer using a high density plasma (HDP) process over the metal interconnect layer and said surface of the semiconductor body, said first oxide layer having a thickness of approximately 6000 Å above said surface of said semiconductor body;
    forming a pattern over said first oxide layer, said pattern covering said plurality of fuses and exposing a portion of said first oxide layer over said plurality of probe pads;

removing said exposed portion of said first oxide layer;

conformally depositing a second oxide layer over said first oxide layer and said plurality of probe pads;

directing a laser pulse toward a selected subset of said plurality of fuses to form cracks in at least said second oxide layer;

wet etching to remove said selected subset of fuses.

10. The method of claim 9, wherein said first oxide layer exposes corners of the plurality of fuses.

11. The method of claim 9, wherein said step of removing said exposed portion of said first oxide layer also removes an upper barrier layer of said top interconnect over said probe pads.

12. The method of claim 9, wherein a portion of said first and second oxide layers over said selected subset of fuses breaks off during said step of directing a laser pulse.

13. The method of claim 9, wherein said second oxide layer has a thickness of approximately 1000 Å.

* * * * *